United States Patent
Yamamoto et al.

(10) Patent No.: US 9,287,434 B2
(45) Date of Patent: Mar. 15, 2016

(54) METHOD FOR PRODUCING SEMICONDUCTOR LAYER, METHOD FOR PRODUCING PHOTOELECTRIC CONVERSION DEVICE, AND SEMICONDUCTOR STARTING MATERIAL

(75) Inventors: Akio Yamamoto, Higashiomi (JP); Seiji Oguri, Higashiomi (JP); Hiromitsu Ogawa, Higashiomi (JP); Aki Kitabayashi, Higashiomi (JP); Shinichi Abe, Uji (JP); Kazumasa Umesato, Omihachiman (JP); Norihiko Matsushima, Yasu (JP); Keizo Takeda, Omihachiman (JP); Manabu Kyuzo, Higashiomi (JP); Ken Nishiura, Shizuoka (JP); Atsuo Hatate, Nara (JP)

(73) Assignee: KYOCERA Corporation, Kyoto (JP)

(*) Notice: Subject to any disclaimer, the term of this patent is extended or adjusted under 35 U.S.C. 154(b) by 161 days.

(21) Appl. No.: 14/129,684
(22) PCT Filed: Jun. 18, 2012
(86) PCT No.: PCT/JP2012/065521
§ 371 (c)(1),
(2), (4) Date: Dec. 27, 2013
(87) PCT Pub. No.: WO2013/002057
PCT Pub. Date: Jan. 3, 2013

(65) Prior Publication Data
US 2014/0127851 A1 May 8, 2014

(30) Foreign Application Priority Data
Jun. 27, 2011 (JP) ................................. 2011-141463
Nov. 15, 2011 (JP) ................................. 2011-249804

(51) Int. Cl.
*H01L 31/18* (2006.01)
*H01L 21/02* (2006.01)
*H01L 31/032* (2006.01)

(52) U.S. Cl.
CPC ............ *H01L 31/18* (2013.01); *H01L 21/0237* (2013.01); *H01L 21/02422* (2013.01);
(Continued)

(58) Field of Classification Search
CPC .................. H01L 21/02485; H01L 21/02551; H01L 21/02568; H01L 21/02628; H01L 21/02469; H01L 21/02502; H01L 31/0322; H01L 31/0324; H01L 31/18; Y02E 10/541
USPC ............................... 438/84, 95, 502; 257/613
See application file for complete search history.

(56) References Cited

U.S. PATENT DOCUMENTS 4,642,140 A * 2/1987 Noufi et al. ...................... 438/95
6,251,701 B1 * 6/2001 McCandless .................... 438/95
(Continued)

FOREIGN PATENT DOCUMENTS

JP H05-267704 A 10/1993
JP 2007-018891 A 1/2007
(Continued)

OTHER PUBLICATIONS

Froment et al., "Metal chalcogenide semiconductor growth from aqueous solutions," Pure & Appl. Chem., vol. 69, No. 1, pp. 77-82, 1997.*
(Continued)

*Primary Examiner* — Mary Wilczewski
(74) *Attorney, Agent, or Firm* — Procopio, Cory, Hargreaves & Savitch LLP

(57) ABSTRACT

Methods for producing a semiconductor layer and for producing a photoelectric conversion device, semiconductor raw material are disclosed. An embodiment of the method for producing a semiconductor layer includes: forming a film containing a metal element and an oxygen element; generating oxygen gas by heating the film; and forming a semiconductor layer containing a metal chalcogenide from the film by allowing the metal element to react with a chalcogen element. Another embodiment of the method includes forming a lower film containing a metal element; forming an upper film, which contains the metal element and a substance that contains oxygen, on the lower film; generating oxygen gas by heating the substance; and forming a semiconductor layer containing a metal chalcogenide from the lower film and the upper film by allowing a chalcogen element to react with the metal element in the lower film and the upper film.

4 Claims, 10 Drawing Sheets

(52) U.S. Cl.
CPC .... *H01L21/02469* (2013.01); *H01L 21/02485* (2013.01); *H01L 21/02491* (2013.01); *H01L 21/02502* (2013.01); *H01L 21/02551* (2013.01); *H01L 21/02568* (2013.01); *H01L 21/02628* (2013.01); *H01L 31/0322* (2013.01); *H01L 31/0324* (2013.01); *Y02E 10/541* (2013.01); *Y02P 70/521* (2015.11)

(56) References Cited

U.S. PATENT DOCUMENTS

| | | | |
|---|---|---|---|
| 9,023,680 B2* | 5/2015 | Inai et al. | 438/87 |
| 2003/0230338 A1* | 12/2003 | Menezes | 136/265 |
| 2011/0030788 A1* | 2/2011 | Fujdala et al. | 136/258 |
| 2012/0003786 A1* | 1/2012 | Aksu et al. | 438/95 |
| 2012/0067424 A1* | 3/2012 | Fujdala et al. | 136/262 |
| 2012/0070937 A1 | 3/2012 | Inai et al. | |
| 2012/0288987 A1* | 11/2012 | Radu et al. | 438/95 |
| 2012/0318358 A1* | 12/2012 | Fujdala et al. | 136/262 |
| 2013/0025671 A1* | 1/2013 | Lim et al. | 136/256 |
| 2014/0127851 A1* | 5/2014 | Yamamoto et al. | 438/95 |
| 2015/0031163 A1* | 1/2015 | Lucas et al. | 438/95 |

FOREIGN PATENT DOCUMENTS

| | | |
|---|---|---|
| JP | 2010-155730 A | 7/2010 |
| JP | 2011-100976 A | 5/2011 |
| WO | 2011/013657 A1 | 2/2011 |

OTHER PUBLICATIONS

English translation of JP 2010-155730.*
International Search Report dated Sep. 4, 2012, issued for International Application No. PCT/JP2012/065521.

* cited by examiner

Fig. 8

| 12.3 | 12.7 | 12.9 | 12.3 | 11.6 | 12.2 |
| --- | --- | --- | --- | --- | --- |
| 11.6 | 12.4 | 12.6 | 12.0 | 11.3 | 11.9 |
| 12.2 | 12.8 | 12.7 | 12.3 | 12.2 | 12.5 |
| 12.9 | 13.1 | 12.6 | 12.6 | 12.6 | 12.9 |

Fig. 9

| 10.0 | 10.9 | 11.3 | 11.0 | 11.0 | 11.4 |
|------|------|------|------|------|------|
| 12.3 | 12.6 | 12.3 | 11.4 | 10.7 | 11.1 |
| 12.5 | 12.8 | 12.7 | 12.1 | 11.2 | 11.2 |
| 11.1 | 11.6 | 11.6 | 10.8 | 11.4 | 11.8 |

Fig. 10

| 10.2 | 11.3 | 12.1 | 11.1 | 11.7 | 11.1 |
| --- | --- | --- | --- | --- | --- |
| 10.2 | 11.5 | 11.6 | 11.3 | 10.0 | 12.4 |
| 10.8 | 11.6 | 11.6 | 10.1 | 9.8 | 11.9 |
| 11.5 | 11.7 | 11.4 | 11.4 | 11.2 | 10.4 |

METHOD FOR PRODUCING SEMICONDUCTOR LAYER, METHOD FOR PRODUCING PHOTOELECTRIC CONVERSION DEVICE, AND SEMICONDUCTOR STARTING MATERIAL

TECHNICAL FIELD

The present invention relates to a method for producing a semiconductor layer containing a metal chalcogenide, a method for producing a photoelectric conversion device with the semiconductor layer, and a semiconductor raw material.

BACKGROUND ART

There are solar cells including photoelectric conversion devices provided with semiconductor layers composed of metal chalcogenides. Examples of metal chalcogenides include group I-III-VI compounds, such as CIS and CIGS; group I-II-IV-VI compounds, such as CZTS; and group II-VI compounds, such as CdTe.

An example of a method for producing such a semiconductor layer is a production method as disclosed in Japanese Unexamined Patent Application Publication No. 5-267704 (hereinafter, referred to as "PTL 1"). In this production method, a group I-B element and a group III-B element, which are metal elements, are separately or simultaneously deposited on an electrode to form a precursor layer. The precursor layer is heated while a gas containing a group VI-B element, which is a chalcogen element, is fed, thereby forming a I-III-VI compound semiconductor.

SUMMARY OF INVENTION

Technical Problem

In recent years, a demand for photoelectric conversion devices has continued to rise, and photoelectric conversion devices are required to have further improved photoelectric conversion efficiency. Thus, it is an object of the present invention to provide a semiconductor layer having high photoelectric conversion efficiency and a photoelectric conversion device including the semiconductor layer.

A method for producing a semiconductor layer according to an embodiment of the present invention includes the steps of forming a film containing a metal element and a substance that generates oxygen by heating, heating the film to generate oxygen from the substance, and forming a semiconductor layer containing a metal chalcogenide from the film by allowing the metal element to react with a chalcogen element.

A method for producing a semiconductor layer according to another embodiment of the present invention includes the steps of forming a lower film containing a metal element, forming an upper film on the lower film, the upper film containing the metal element and a substance that generates oxygen by heating, heating the upper film to generate oxygen from the substance, and forming a semiconductor layer containing a metal chalcogenide from the lower film and the upper film by allowing a chalcogen element to react with the metal element in the lower film and the upper film.

A method for producing a photoelectric conversion device according to another embodiment of the present invention includes the steps of producing a first semiconductor layer according to any one of the foregoing methods for producing semiconductor layers, and producing a second semiconductor layer having a conductivity type different from the first semiconductor layer, the second semiconductor layer, and electrically connected to the first semiconductor layer.

A semiconductor raw material according to another embodiment of the present invention contains a metal element and a substance that generates oxygen by heating.

BRIEF DESCRIPTION OF DRAWINGS

FIG. 8 is a diagram illustrating an in-plane distribution of photoelectric conversion efficiency of a photoelectric conversion device according to an example.

FIG. 9 is a diagram illustrating an in-plane distribution of an photoelectric conversion efficiency of a photoelectric conversion device according to an example.

FIG. 10 is a diagram illustrating an in-plane distribution of the photoelectric conversion efficiency of a photoelectric conversion device according to an example.

DESCRIPTION OF EMBODIMENTS

An embodiment of the present invention will be described in detail below with reference to the drawings.

<<(1) Structure of Photoelectric Conversion Device>>

Figure 1:
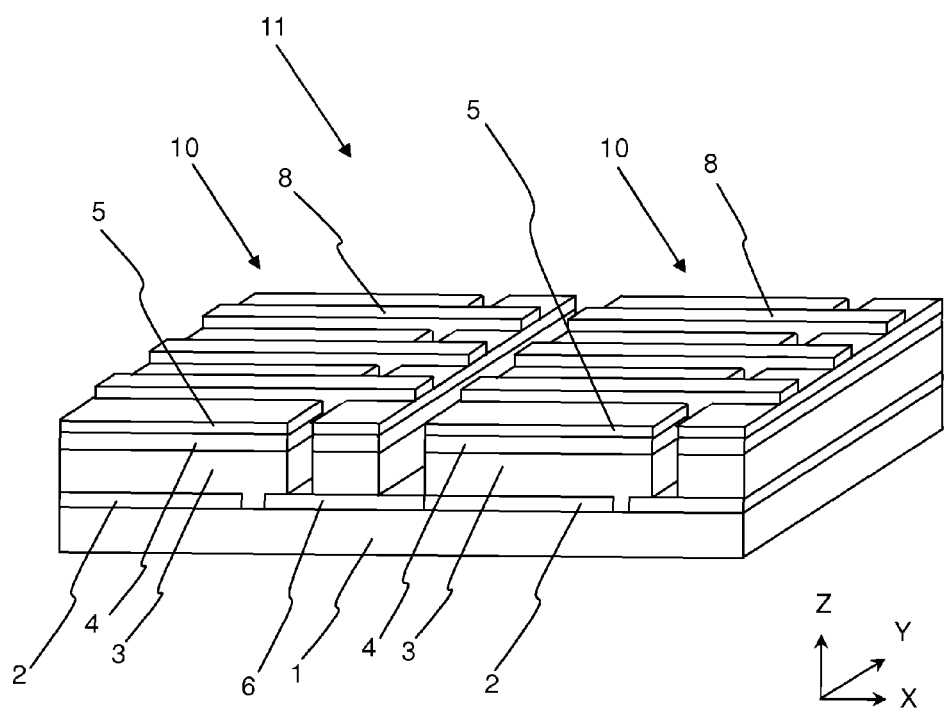
FIG. 1 is a perspective view illustrating an example of a photoelectric conversion device produced by a method for producing a semiconductor layer according to an embodiment of the present invention and by a method for producing a photoelectric conversion device according to an embodiment of the present invention.
Figure 2:
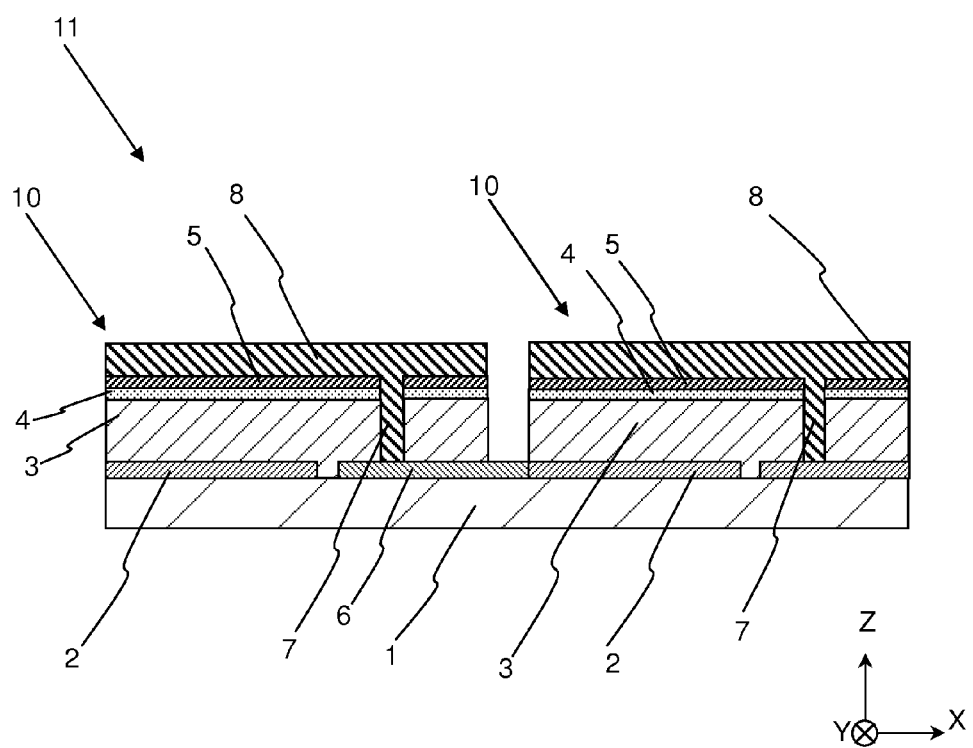
FIG. 2 is a cross-sectional view of the photoelectric conversion device illustrated in FIG. 1.

FIG. 1 is a perspective view illustrating a photoelectric conversion device produced by a method for producing a semiconductor layer according to an embodiment of the present invention and by a method for producing a photoelectric conversion device according to an embodiment of the present invention. FIG. 2 is a cross-sectional view of the photoelectric conversion device. In FIGS. 1 to 7, a right-handed XYZ coordinate system in which the direction of the arrangement of photoelectric conversion cells 10 (the transverse direction in FIG. 1) is the direction of the X-axis is used. A photoelectric conversion device 11 includes a substrate 1, first electrode layers 2, first semiconductor layers 3 each containing a metal chalcogenide, second semiconductor layers 4, and second electrode layers 5.

The first semiconductor layers 3 are different in conductivity type from the second semiconductor layers 4. The charge separation of positive and negative carriers formed by light irradiation may be performed satisfactorily with the first semiconductor layers 3 and the second semiconductor layers 4. For example, in the case where the first semiconductor layers 3 are p-type, the second semiconductor layers 4 are n-type. Alternatively, each of the second semiconductor layers 4 may be formed of a plurality of layers including a semiconductor layer different in conductivity type from a buffer layer and the first semiconductor layers 3. In this embodiment, each of the first semiconductor layers 3 is a light-absorbing layer of a first conductivity type, and each of the second semiconductor layers 4 serves as both a buffer layer and a semiconductor layer having a second conductivity type.

In the photoelectric conversion device 11 according to this embodiment, light is incident on the side of the second electrode layers 5. However, the photoelectric conversion device 11 is not limited thereto and may have a structure in which light is incident on the side of the substrate 1.

In FIG. 1, the photoelectric conversion device 11 includes the plural photoelectric conversion cells 10 arranged. Each of the photoelectric conversion cells 10 is provided with a third electrode layer 6 on a side of the corresponding first semiconductor layer 3 adjacent to the substrate 1, the third electrode layer 6 being separated from the corresponding first electrode layer 2. The second electrode layers 5 are electrically connected to the third electrode layers 6 with connecting conductors 7 in the first semiconductor layers 3. In FIG. 1, the third electrode layer 6 is an extension of the first electrode layer 2 of the adjacent photoelectric conversion cell 10. This structure results in the series connection of adjacent photoelectric conversion cells 10. In one photoelectric conversion cell 10, the connecting conductors 7 passes through the first semiconductor layers 3 and the second semiconductor layers 4, and photoelectric conversion is performed in the first semiconductor layer 3 and the second semiconductor layer 4 between the first electrode layer 2 and the second electrode layer 5.

The substrate 1 is configured to support the first semiconductor layers 3 and the second semiconductor layers 4. Examples of a material for the substrate 1 include glass, ceramics, resins, and metals.

The first electrode layers 2 and the third electrode layers 6 are composed of a conductive material selected from Mo, Al, Ti, Au, and so forth and are formed on the substrate 1 by a method selected from a sputtering method, an evaporation method, and so forth.

The first semiconductor layers 3 are semiconductor layers mainly containing a metal chalcogenide. Metal chalcogenides refer to compounds of metal elements and chalcogen elements. Chalcogen elements refer to S, Se, and Te in group VI-B elements (also referred to as "group 16 elements"). Examples of metal chalcogenides include II-VI group compounds, I-III-VI group compounds, and I-II-IV-VI group compounds.

II-VI group compounds refer to compounds of group II-B elements (also referred to as "group 12 elements") and group VI-B elements. An example thereof is CdTe.

I-III-VI group compounds refer to compounds of group I-B elements (also referred to as "group 11 elements"), group III-B elements (also referred to as "group 13 elements"), and group VI-B elements. Examples thereof include $Cu(In, Ga)Se_2$ (also referred to as "CIGS"), $Cu(In, Ga)(Se, S)_2$ (also referred to as "CIGSS"), and $CuInSe_2$ (also referred to as "CIS"). $Cu(In, Ga)Se_2$ refers to a compound mainly composed of Cu, In, Ga, and Se. $Cu(In, Ga)(Se, S)_2$ refers to a compound containing Cu, In, Ga, Se, and S as main components.

I-II-IV-VI group compounds refer to compounds of group I-B elements, group II-B elements, group IV-B elements (also referred to as "group 14 elements"), and group VI-B elements. An example thereof is $Cu_2ZnSn(Se, S)_4$.

The second semiconductor layers 4 are arranged on the first semiconductor layers 3. In this embodiment, each of the first semiconductor layers 3 serves as a light-absorbing layer of a first conductivity type, and each of the second semiconductor layers 4 serves as both a buffer layer and a semiconductor layer of a second conductivity type. From the viewpoint of reducing a leakage current, each of the second semiconductor layers 4 may have a resistivity of 1 Ω·cm or more. Examples of the second semiconductor layers 4 include CdS, ZnS, ZnO, $In_2Se_3$, In(OH, S), (Zn, In)(Se, OH), and (Zn, Mg)O. The second semiconductor layers 4 are formed by, for example, a chemical bath deposition (CBD) method. In(OH, S) refers to a compound containing In, OH, and S as main components. (Zn, In)(Se, OH) refers to a compound Zn, In, Se, and OH as main components. (Zn, Mg)O refers to a compound Zn, Mg, and O as main components. To increase the absorption efficiency of the first semiconductor layers 3, the second semiconductor layers 4 may have high light transmittance with respect to the wavelength range of light absorbed by the first semiconductor layers 3.

Each of the second semiconductor layers 4 has a thickness of 10 to 200 nm. From the viewpoint of reducing damage from the formation of the second electrode layers 5 on the second semiconductor layers 4 by sputtering or the like, each of the second semiconductor layers 4 may have a thickness of 100 to 200 nm.

Each of the second electrode layers 5 is a transparent conductive film which is composed of, for example, ITO or ZnO, and which has a thickness of 0.05 to 3.0 μm. The second electrode layers 5 are formed by a sputtering method, an evaporation method, a chemical vapor deposition (CVD) method, or the like. The second electrode layers 5 are layers having a lower resistivity than the second semiconductor layers 4 and configured to acquire charges generated in the first semiconductor layers 3. From the viewpoint of satisfactorily acquiring charges, each of the second electrode layers 5 may have a resistivity of less than 1 Ω·cm and a sheet resistance of 50Ω/□ or less. Note that the second electrode layers 5 may be omitted and that the second semiconductor layers 4 may also serve as the second electrode layers 5.

To enhance the absorption efficiency of the first semiconductor layers 3, the second electrode layers 5 may be highly transparent to light to be absorbed by the first semiconductor layers 3. Each of the second electrode layers 5 may have a thickness of 0.05 to 0.5 μm from the viewpoint of enhancing the effect of reducing optical loss due to reflection and the effect of scattering light together with an increase in optical transparency and of satisfactorily conducting a current generated by photoelectric conversion. The refractive index of each of the second electrode layers 5 may be substantially equal to that of a corresponding one of the second semiconductor layers 4 from the viewpoint of reducing the optical loss due to reflection at the boundaries between the second electrode layers 5 and the second semiconductor layers 4.

The plural photoelectric conversion cells 10 are arranged and electrically connected to each other to provide the photoelectric conversion device 11. To easily connect adjacent photoelectric conversion cells 10 in series, each of the photoelectric conversion cells 10 is provided with a corresponding one of the third electrode layers 6 on a side of a corresponding one of the first semiconductor layers 3 adjacent to the substrate 1, the corresponding third electrode layer 6 being separated from a corresponding one of the first electrode layers 2, as illustrated in FIG. 1. The second electrode layers 5 are electrically connected to the third electrode layers 6 with the connecting conductors 7 arranged in the first semiconductor layers 3.

In FIG. 2, the connecting conductors 7 are formed by filling trenches that pass through (separate) the first semiconductor layers 3, the second semiconductor layers 4, and the second electrode layers 5 with a conductor, such as a conductive paste. The connecting conductors 7 are not limited thereto and may be formed by the extension of the second electrode layers 5. The connecting conductors 7 are not limited to the structure in which the connecting conductors 7 are arranged in the trenches that pass through (separate) the first semiconductor layers 3, the second semiconductor layers 4, and the second electrode layers 5. Each of the connecting conductors 7 may be arranged along a side face of a laminate including the corresponding layers.

As illustrated in FIG. 1, collector electrodes 8 may be arranged on the second electrode layers 5. The collector electrodes 8 are configured to reduce the electrical resistance of the second electrode layers 5. The arrangement of the collector electrodes 8 on the second electrode layers 5 reduces the thickness of the second electrode layers 5 to increase the optical transparency and efficiently acquires a current generated in the first semiconductor layers 3. This results in an increase in the power generation efficiency of the photoelectric conversion device 11.

For example, as illustrated in FIG. 1, each of the collector electrodes 8 is linearly arranged from an end of a corresponding one of the photoelectric conversion cells 10 to a corresponding one of the connecting conductors 7. Thus, charges generated in the first semiconductor layers 3 by photoelectric conversion are collected to the collector electrodes 8 through the second electrode layers 5 and satisfactorily transferred to an adjacent photoelectric conversion cell 10 through the connecting conductors 7. Note that the second electrode layers 5 may be omitted and the collector electrodes 8 may be arranged on the second semiconductor layers 4.

Each of the collector electrodes 8 may have a width of 50 to 400 μm from the viewpoint of reducing the shielding of light incident on the first semiconductor layers 3 and achieving satisfactory electrical conductivity. Furthermore, each of the collector electrodes 8 may include a plurality of branched portions.

For example, the collector electrodes 8 are formed by applying a metal paste in a pattern by printing, the metal paste containing a metal powder, such as Ag, dispersed in a resin binder or the like, and then the curing of the paste.

<<(2)Method for Producing First Semiconductor Layer>>
<(2-1) First Method>

The first semiconductor layers 3 containing a metal chalcogenide may be formed as described below. A film containing a metal element, a chalcogen element, and a substance that generates oxygen by heating (hereinafter, the substance that generates oxygen by heating is referred to as an "oxygen-generating agent") is formed on the substrate 1 including the first electrode layers 2. The film may be formed by applying a liquid semiconductor raw material that contains a metal element, a chalcogen element, an oxygen-generating agent, and a solvent onto the first electrode layers 2 using a coating method, for example, a spin coating, screen printing, dipping, spraying, or a die coating, to form a film-like shape and removing the solvent by drying. Note that the film formation may be repeated more than once to form a laminate including a plurality of films.

Examples of the oxygen-generating agent include chlorates, perchlorates, chlorites, bromates, nitrates, iodates, permanganates, dichromates, and inorganic peroxides.

Examples of chlorates include $KClO_3$, $NaClO_3$, and $NH_4ClO_3$. Examples of perchlorates include $KClO_4$, $NaClO_4$, and $NH_4ClO_4$. An example of chlorites is $NaClO_2$. An example of bromates is $KBrO_3$. Examples of nitrates include $KNO_3$, $NaNO_3$, and $NH_4NO_3$. Examples of iodates include $NaIO_3$ and $KIO_3$. Examples of permanganates include $KMnO_4$ and $NaMnO_4.3H_2O$. Examples of dichromates include $K_2Cr_2O_7$ and $(NH_4)_2Cr_2O_7$. Examples of inorganic peroxides include $K_2O_2$, $Na_2O_2$, $Cu_2O_2$, $MgO_2$, and $BaO_2$.

From the viewpoint of increasing the crystallinity of the first semiconductor layers 3, a compound containing an alkali metal element, e.g., $KClO_3$, $NaClO_3$, $KClO_4$, $NaClO_4$, $NaClO_2$, $KBrO_3$, $KNO_3$, $NaNO_3$, $NaIO_3$, or $KIO_3$, may be used as the oxygen-generating agent.

From the viewpoint of achieving satisfactory semiconducting properties of the first semiconductor layers 3, the film may have an oxygen-generating agent content of 1% to 50% by mole with respect to the total number of moles of all the metal elements in the film (that is, 1 to 50 mol of the oxygen-generating agent is contained with respect to 100 mol of all the metal elements in the film).

Next, the foregoing film is heated to 50° C. to 600° C. in an inert gas atmosphere, such as nitrogen gas, or a reducing gas atmosphere, such as hydrogen gas. This results in the generation of oxygen from the oxygen-generating agent and causes the reaction between the metal element and the chalcogen element, thereby forming the first semiconductor layers 3 containing the metal chalcogenide. At this time, oxygen generated by heating seemingly functions to promote the crystallization of the metal chalcogenide, thus providing the first semiconductor layers 3 which contain satisfactory metal chalcogenide crystals and which have high photoelectric conversion efficiency. This is presumably due to the following phenomenon: That is, oxygen is generated in the film, so oxygen is efficiently present in the film. Thus, the metal element is partially oxidized, resulting in a state in which the metal element and a metal oxide are mixed. Then the formation of the chalcogenide of the metal element proceeds, thereby forming small particles composed of the metal chalcogenide. In contrast, the formation of the chalcogenide of the metal oxide does not proceed immediately. The metal oxide is temporarily changed into a metal having flowability. The metal enters gaps between the small particles composed of the metal chalcogenide to form a dense state, and then the formation of the chalcogenide proceeds. As described above, the formation of the chalcogenide proceeds in the dense state, thus presumably promoting the crystallization.

With respect to heating conditions of the film, a one-stage temperature control in which the temperature is maintained at 400° C. to 600° C., at which the metal chalcogenide is crystallized to form a polycrystal, may be used. However, the heating conditions are not limited thereto. For example, a two-stage temperature control in which the temperature is maintained at 50° C. to 350° C., which is a relatively low temperature, to generate oxygen and then maintained at 400° C. to 600° C., at which the metal chalcogenide is crystallized to form a polycrystal, may also be used. In the case of such two-stage heating conditions, unnecessary components, such as organic components, are successively eliminated at a first stage, and then the crystallization proceeds satisfactorily at a second stage. Thus, the first semiconductor layers 3 tend to have better crystallinity.

From the viewpoint of further promoting a reaction to form the chalcogenide, a chalcogen element may be contained in an atmosphere during the heating of the film in the form of, for example, sulfur vapor, hydrogen sulfide, selenium vapor, or hydrogen selenide. Alternatively, a chalcogen element-containing gas, for example, hydrogen sulfide or hydrogen selenide, may be used as the whole of the atmospheric gas.

<(2-2) Second Method>

The first semiconductor layers 3 containing a metal chalcogenide may also be formed by a method described below. In a second method, no chalcogen element is contained in a film. The chalcogenide of a metal element is formed by the supply of a chalcogen element from an ambient atmosphere.

A film containing a metal element and an oxygen-generating agent is formed. The film may be formed by applying a liquid semiconductor raw material that contains the metal element, the oxygen-generating agent, and a solvent onto the first electrode layers 2 using a coating method, for example, a spin coating, screen printing, dipping, spraying, or a die coating, to form a film-like shape and removing the solvent by drying. Note that the film formation may be repeated more than once to form a laminate including a plurality of films.

The raw material containing the metal element and the oxygen-generating agent may be the same as those used in the first method. The oxygen-generating agent content with respect to the total number of moles of all the metal elements in the film may be the same as that in the first method.

Next, the film is heated to 50° C. to 600° C. in an inert gas atmosphere, such as nitrogen gas, or a reducing gas atmosphere, such as hydrogen gas, thereby generating oxygen from the oxygen-generating agent. Then the film is heated to 50° C. to 600° C. in a chalcogen element-containing atmosphere, thereby forming the first semiconductor layers 3 containing the metal chalcogenide. As with the first method, the second method provides the first semiconductor layers 3 which contain satisfactory metal chalcogenide crystals and which have high photoelectric conversion efficiency. In the case of such two-stage heating treatment in which after heating is performed in a chalcogen element-free atmosphere, heating is performed in a chalcogen element-containing atmosphere as described above, unnecessary components, such as organic components, are successfully eliminated at a first stage, and then the crystallization proceeds satisfactorily at the second stage. Thus, the first semiconductor layers 3 tend to have better crystallinity.

<(2-3) Third Method>

The first semiconductor layers 3 containing a metal chalcogenide may also be formed by a method described below. As with the second method, in a third method, no chalcogen element is contained in a film. The chalcogenide of a metal element is formed by the supply of a chalcogen element from an ambient atmosphere.

A film containing a metal element and an oxygen-generating agent is formed. The film may be formed by applying a liquid semiconductor raw material that contains the metal element, the oxygen-generating agent, and a solvent onto the first electrode layers 2 using a coating method, for example, a spin coating, screen printing, dipping, spraying, or a die coating, to form a film-like shape and removing the solvent by drying. Note that the film formation may be repeated more than once to form a laminate including a plurality of films.

The metal element and the oxygen-generating agent may be the same as those used in the first method. The oxygen-generating agent content with respect to the total number of moles of all the metal elements in the film may be the same as that in the first method.

Next, the film is heated to 50° C. to 600° C. in a chalcogen element-containing atmosphere. This results in the generation of oxygen from the oxygen-generating agent and causes the reaction between the metal element and the chalcogen element, thereby forming the first semiconductor layers 3 containing the metal chalcogenide. As with the first method, the third method provides the first semiconductor layers 3 which contain satisfactory metal chalcogenide crystals and which have high photoelectric conversion efficiency.

<(2-4) Forth Method>

In each of the first to third methods, the position of the oxygen-generating agent in the film containing the metal element and the oxygen-generating agent is not particularly limited. The film to be formed into the first semiconductor layers 3 may contain the oxygen-generating agent in a portion of the film in the thickness direction. In a forth to sixth methods, examples of the production methods will be described below. In each of the fourth to sixth methods, a lower film containing a metal element is formed on the first electrode layers 2 in the form of a single layer or a laminate including multiple layers. An upper film containing the metal element and an oxygen-generating agent is formed on the lower film in the form of a single layer or a laminate including multiple layers. That is, the oxygen-generating agent is present on the upper side of the multilayer film. In this structure, the crystallization of the whole of each of the first semiconductor layers 3 to be formed proceeds readily. This reduces in-plane variations in photoelectric conversion efficiency and further increases the photoelectric conversion efficiency.

The fourth method will be described. The lower film formed on the first electrode layers 2 contains at least a metal element. The lower film may be formed by a solution coating method with a raw material solution, a thin-film formation method, e.g., a sputtering method or an evaporation method, or another method. Note that the lower film may contain a chalcogen element. In the case where the lower film does not contain a chalcogen element, a chalcogen element may be supplied from the ambient atmosphere to form the chalcogenide of the metal element. In the case where the lower film contains a chalcogen element, the chalcogenide of the metal element may be formed with the chalcogen element in the lower film, and the chalcogen element may be supplied from the ambient atmosphere to form the chalcogenide of the metal element.

In the case where the lower film is formed by a solution coating method with a raw material solution, the raw material solution may contain the components in the semiconductor raw material used to form the upper film other than the oxygen-generating agent. As described above, the lower film is formed in the same way as the formation method of the upper film, so the lower film and the upper film react satisfactorily with each other, thereby resulting in the satisfactory formation of the first semiconductor layers 3.

The upper film formed on the lower film contains the metal element, the chalcogen element, and the oxygen-generating agent. As with the foregoing first method, the upper film may be formed by applying a liquid semiconductor raw material that contains the metal element, the oxygen-generating agent, and a solvent onto the lower film using a coating method to form a film-like shape and removing the solvent by drying.

Next, a stack of the lower film and the upper film is heated to 50° C. to 600° C. in an inert gas atmosphere, such as nitrogen gas, a reducing gas atmosphere, such as hydrogen gas, or a chalcogen element-containing atmosphere. This results in the generation of oxygen from the oxygen-generating agent and causes the reaction between the metal element and the chalcogen element, thereby forming the first semiconductor layers 3 containing the metal chalcogenide.

Here, in the case where the lower film and the upper film to be formed into the first semiconductor layers 3 are stacked in such a manner that an upper layer portion contains the oxygen-generating agent as described above, a large amount of a metal oxide is formed in the upper layer portion, and a relatively small amount of the metal oxide is formed in a lower layer portion. This results in the suppression of the fact that an oxygen element in the lower layer portion and the middle portion of the stack is not sufficiently replaced with the chalcogen element and is remained. Thus, the chalcogenide is satisfactorily formed in the overall stack, thereby more satisfactorily forming the first semiconductor layers 3. This reduces in-plane variations in photoelectric conversion efficiency and further increases the photoelectric conversion efficiency. In the foregoing heating step, two-stage heating treatment in which after heating is performed in a chalcogen element-free atmosphere, heating is performed in a chalcogen element-containing atmosphere may be performed. In the case of the two-stage heating treatment, unnecessary components, such as organic components, are successfully eliminated at a first stage, and then the crystallization proceeds satisfactorily at a second stage. Thus, the first semiconductor layers 3 tend to have better crystallinity.

<(2-5) Fifth Method>

The first semiconductor layers 3 containing a metal chalcogenide may be formed by a method described below. In a fifth method, no chalcogen element is contained in an upper film. The chalcogenide of a metal element is formed by the supply of a chalcogen element from an ambient atmosphere.

As with the fourth method, a lower film containing the metal element is formed. To satisfactorily form a metal chalcogenide, the lower film may contain the chalcogen element.

Next, the upper film containing the metal element and an oxygen-generating agent is formed on the lower film. As with the second method, the upper film may be formed by applying a liquid semiconductor raw material that contains the metal element, the oxygen-generating agent, and a solvent onto the lower film using a coating method to form a film-like shape and removing the solvent by drying.

A stack of the lower film and the upper film is heated to 50° C. to 600° C. in an inert gas atmosphere, such as nitrogen gas or a reducing gas atmosphere, such as hydrogen gas, thereby generating oxygen from the oxygen-generating agent. Then the lower film and the upper film are heated to 50° C. to 600° C. in an atmosphere containing a chalcogen element in the form of, for example, sulfur vapor, hydrogen sulfide, selenium vapor, or hydrogen selenide, thereby forming the first semiconductor layers 3 containing the metal chalcogenide. As with the fourth method, in the fifth method, the chalcogenide is satisfactorily formed in the overall stack, thereby more satisfactorily forming the first semiconductor layers 3. This reduces in-plane variations in photoelectric conversion efficiency and further increases the photoelectric conversion efficiency.

<(2-6) Sixth Method>

The first semiconductor layers 3 containing a metal chalcogenide may also be formed by a method described below. As with the fifth method, in a sixth method, no chalcogen element is contained in an upper film. The chalcogenide of a metal element is formed by the supply of a chalcogen element from an ambient atmosphere.

As with the fourth method, a lower film containing the metal element is formed. To satisfactorily form a metal chalcogenide, the lower film may contain the chalcogen element.

Next, the upper film containing the metal element and an oxygen-generating agent is formed on the lower film. As with the second method, the upper film may be formed by applying a liquid semiconductor raw material that contains the metal element, the oxygen-generating agent, and a solvent onto the lower film using a coating method to form a film-like shape and removing the solvent by drying.

A stack of the lower film and the upper film is heated to 50° C. to 600° C. in an atmosphere containing a chalcogen element in the form of, for example, sulfur vapor, hydrogen sulfide, selenium vapor, or hydrogen selenide. This results in the generation of oxygen from the oxygen-generating agent and causes the reaction between the metal element and the chalcogen element, thereby forming the first semiconductor layers 3 containing the metal chalcogenide. As with the fourth method, in the sixth method, the chalcogenide is satisfactorily formed in the overall stack, thereby more satisfactorily forming the first semiconductor layers 3. This reduces in-plane variations in photoelectric conversion efficiency and further increases the photoelectric conversion efficiency.

<<(3) Method for Preparing Semiconductor Raw Material>>

A method for preparing the semiconductor raw material used in the method for producing the first semiconductor layers will be described in detail. In the method for producing the first semiconductor layers, the method for forming the film to be formed into a semiconductor layer is not limited to a method for forming a film by applying a liquid semiconductor raw material as described below. A dry method for forming a thin film with a solvent-free solid semiconductor raw material may be employed.

The semiconductor raw material contains the metal element and the oxygen-generating agent that are dispersed or dissolved in the solvent (hereinafter, the semiconductor raw material containing the metal element, the oxygen-generating agent, and the solvent is referred to as a "first semiconductor raw material"), as described in the second method, the third method, the fifth method, and the sixth method. Alternatively, the chalcogen element in addition to the metal element and the oxygen-generating agent may be dispersed or dissolved in the solvent (hereinafter, the semiconductor raw material containing the metal element, the chalcogen element, the oxygen-generating agent, and the solvent is referred to as a "second semiconductor raw material"), as described in the first method and the fourth method.

The first semiconductor raw material may be prepared by dispersing or dissolving the oxygen-generating agent and a raw material containing the metal element in the solvent. The second semiconductor raw material may be prepared by dispersing or dissolving a raw material containing the chalcogen element in addition to the oxygen-generating agent and the raw material containing the metal element in the solvent.

As the raw material containing the metal element, a metal or a metal compound may be used. Examples of the metal include elemental metals and alloys. An example of the metal compound is a nonoxide compound. Examples thereof include metal salts and metal complexes.

As the raw material containing the chalcogen element, an elemental chalcogen element or a chalcogen compound may be used. Examples of the chalcogen compound that may be used include organic compounds containing chalcogen elements and inorganic compounds containing chalcogen elements.

The solvent is not particularly limited as long as the raw materials, such as the metal element and the oxygen-generating agent, can be dissolved or dispersed therein. Examples of the solvent include basic solvents, such as pyridine and aniline, and alcohols.

The raw material containing the metal element and the raw material containing the chalcogen element need not be a mixture. A compound of a metal element with a chalcogen element is also included. A complex compound in which a metal element and a chalcogen element are present in one complex molecule may be used from the viewpoint of increasing reactivity to satisfactorily crystallize the first semiconductor layers 3. An example of the complex compound is one in which an organic chalcogen compound is coordinated to a metal element.

The organic chalcogen compound refers to an organic compound which contains a chalcogen element and a covalent bond between a carbon element and the chalcogen element. Examples of the organic chalcogen compound include thiols, sulfides, disulfides, thiophene, sulfoxides, sulfones, thioketones, sulfonic acid, sulfonic acid esters, sulfonamides, selenols, selenides, diselenides, selenoxides, selenones, tellurols, tellurides, and ditellurides. In particular, thiols, sulfides, disulfides, selenols, selenides, diselenides, tellurols, tellurides, and ditellurides may be used from the viewpoint of achieving high coordination ability and the easy formation of a stable complex with a metal element.

For example, in the case where the metal element is a group III-B element, the complex compound in which the organic chalcogen compound is coordinated to the metal element is expressed as $A^{3\oplus}[ME_4]^-$ (hereinafter, referred to as a "group III complex") where M represents the group III-B element, E represents the organic chalcogen compound, and $A^+$ represents a freely-selected cation. The group III complex $A^{3\oplus}$ $[ME_4]^-$ may be prepared by allowing a salt of a group III-B element, $M^{3+}B^-_3$ $B^-$ represents a freely-selected anion), to react with a salt of the organic chalcogen compound, $A^+E^-$. $A^+B^-$ is formed as a by-product of the reaction. The by-product $A^+B^-$ may be removed by washing. Alternatively, in the case where the anion B is selected in such a manner that the by-product $A^+B^-$ serves as an oxygen-generating agent, it is possible to use the by-product $A^+B^-$ as the oxygen-generating agent. This eliminates the need for a washing step to simplify the process. In particular, in the case where A is an alkali metal element, the alkali metal element also has the function to promote a crystallization reaction during the formation of the semiconductor layer. It is thus possible to effectively use the by-product containing the alkali metal element.

Specifically, in the case where the cation $A^+$ is $Na^+$, the anion $B^-$ is $ClO_4^-$, the group III-B element is In, and the organic chalcogen compound E is phenylselenol, the reaction of $Na(SePh)$ with $In(ClO_4)_3$ gives $Na[In(SePh)_4]$, which is a complex compound in which the organic chalcogen compound is coordinated to the metal element, and a by-product $NaClO_4$, which serves as an oxygen-generating agent. Similarly, the reaction of $Na(SePh)$ with $Ga(ClO_4)_3$ gives $Na[Ga(SePh)_4]$ and a by-product $NaClO_4$.

In the case where the metal chalcogenide in the first semiconductor layers 3 contains a plurality of types of metal elements, the semiconductor raw material may contain a complex compound in which the plural metal elements and the chalcogen element are present in one complex molecule from the viewpoint of increasing reactivity to satisfactorily crystallize the first semiconductor layers 3. As the complex compound, for example, in the case where the metal chalcogenide in the first semiconductor layers 3 is a I-III-VI group compound, a complex compound in which a group I-B element, a group III-B element, and a chalcogen element (a group VI-B element) are present in one complex molecule is used. A specific example of the complex compound is a compound represented by structural formula (1) where $M^I$ represents a group I-B element, M represents a group III-B element, L's each represent a Lewis base, and E's each represent an organic chalcogen compound.

[Chem. 1]

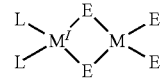

The Lewis base is a compound having a lone pair. Examples of the Lewis base include compounds containing functional groups having group V-B elements (also referred to as "group 15 elements") with lone pairs and compounds containing functional groups having group VI-B elements with lone pairs. Specific examples of the Lewis base include $P(C_6H_5)_3$, $As(C_6H_5)_3$, and $N(C_6H_5)_3$.

Specific examples of the complex compound represented by structural formula (1) include compounds represented by structural formulae (2) and (3). In these structural formulae, Ph's each represent a phenyl group.

[Chem. 2]

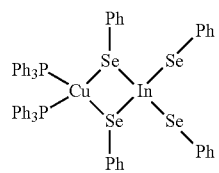

[Chem. 3]

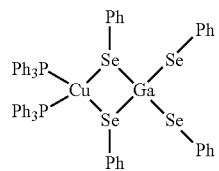

For example, in the case where the Lewis base L is triphenylphosphine and where the organic chalcogen compound E is phenylselenol, the complex compound represented by structural formula (1) may be formed by the reaction of $\{P(C_6H_5)_3\}_2MI(CH_3CN)_2\cdot PF_6$, which is a compound of a group I-B element, and $A^+[M(SePh)_4]^-$, which is a group III complex. In the case where the group III-B element M is In, a complex compound represented by structural formula (2) is formed. In the case where the group III-B element M is Ga, a complex compound represented by structural formula (3) is formed.

As described above, in the case where the anion $B^-$ is selected in such a manner that a by-product formed during the production process of $A^+[M(SePh)_4]^-$, which is a group III complex, serves as an oxygen-generating agent, the by-product may be used as the oxygen-generating agent. This eliminates the need for a washing step to simplify the process. In particular, in the case where A is an alkali metal element, the alkali metal element also has the function to promote a crystallization reaction during the formation of the semiconductor layer. It is thus possible to effectively use the by-product containing the alkali metal element.

<<(4) Method for Producing Photoelectric Conversion Device>>

FIGS. 3 to 7 are each a cross-sectional view schematically illustrating a state of the photoelectric conversion device 11 in process of manufacture. Each of the cross-sectional views depicted in FIGS. 3 to 7 illustrates a state of a portion, corresponding to the cross-sectional view in FIG. 2, in process of manufacture.

Figure 3:
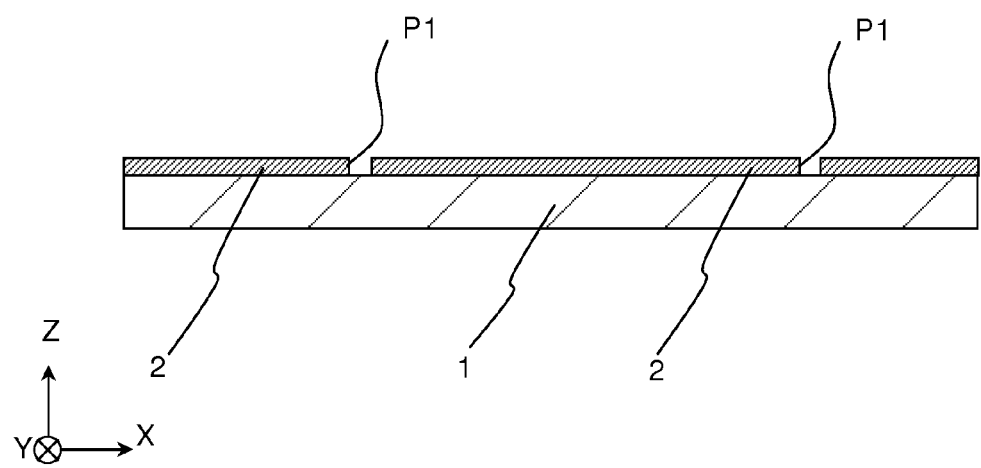
FIG. 3 is a cross-sectional view schematically illustrating a state of a photoelectric conversion device in process of manufacture.

The first electrode layer 2 composed of Mo or the like is formed on substantially the entire surface of the cleaned substrate 1 by a sputtering method or the like. First groove portions P1 are formed from formation target portions of the upper surface of the first electrode layer 2, the formation target portions extending linearly in the Y direction, to portions of the upper surface of the substrate 1 directly below the formation target portions. The first groove portions P1 may be formed by a scribing process in which grooves are formed by irradiating the formation target portions with laser light, such as YAG laser, while the laser light is scanned. FIG. 3 illustrates a state after the formation of the first groove portions P1.

Figure 4:
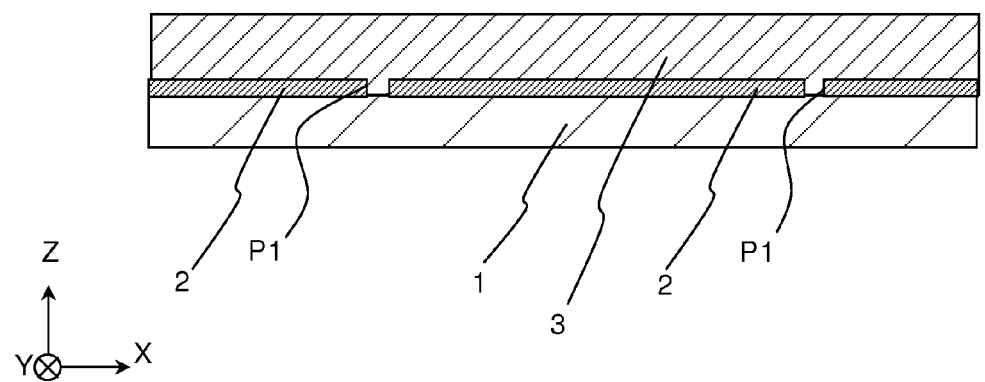
FIG. 4 is a cross-sectional view schematically illustrating a state of a photoelectric conversion device in process of manufacture.

After the formation of the first groove portions P1, the first semiconductor layer 3 is formed on the first electrode layers 2. The first semiconductor layer 3 is formed by the foregoing method for producing the first semiconductor layers 3. FIG. 4 illustrates a state after the formation of the first semiconductor layer 3.

After the formation of the first semiconductor layer 3, the second semiconductor layer 4 and the second electrode layer 5 are successively formed on the first semiconductor layer 3.

The second semiconductor layer 4 may be formed by a chemical bath deposition method (also referred to as a "CBD method"). For example, the substrate 1 on which the first semiconductor layer 3 has been formed is immersed in aqueous ammonia in which cadmium acetate and thiourea are dissolved, thereby forming the second semiconductor layer 4 containing CdS on the first semiconductor layer 3.

Figure 5:
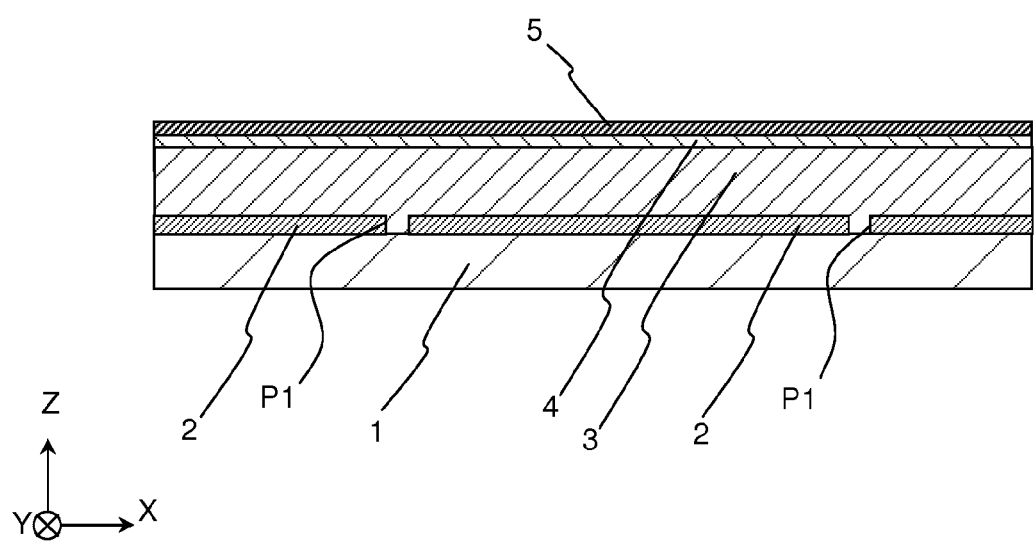
FIG. 5 is a cross-sectional view schematically illustrating a state of a photoelectric conversion device in process of manufacture.

The second electrode layer 5 is a transparent conductive film mainly composed of, for example, indium tin oxide (ITO) containing Sn and may be formed by a sputtering method, an evaporation method, a CVD method, or the like. FIG. 5 illustrates a state after the formation of the second semiconductor layer 4 and the second electrode layer 5.

Figure 6:
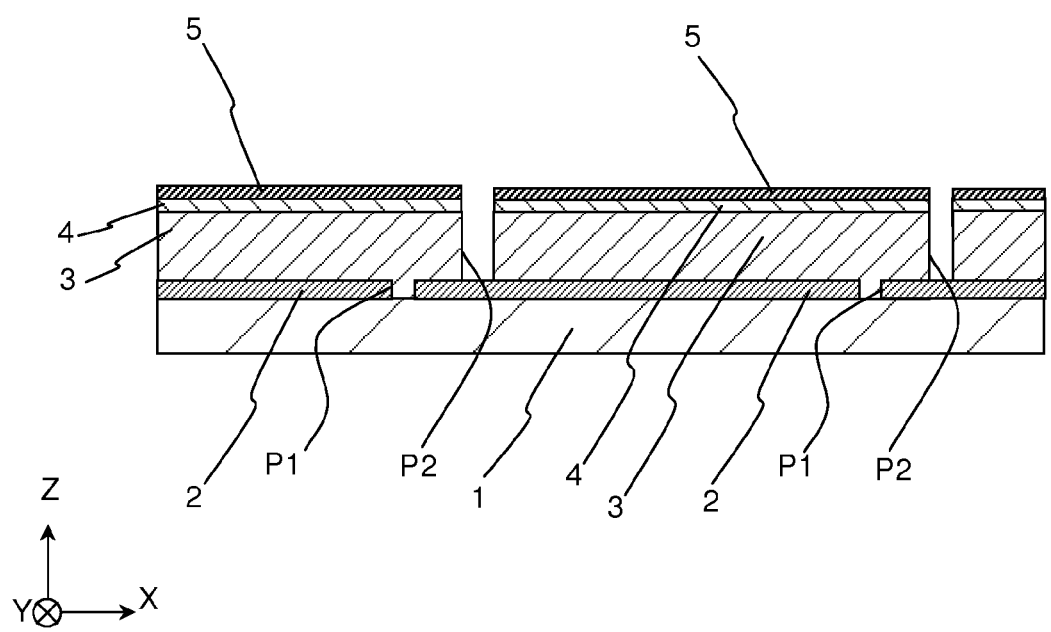
FIG. 6 is a cross-sectional view schematically illustrating a state of a photoelectric conversion device in process of manufacture.

After the formation of the second electrode layer 5, second groove portions P2 are formed from formation target portions of the upper surface of the second electrode layer 5, the formation target portions extending linearly in the Y direction, to portions of the upper surface of the first electrode layers 2 (portions corresponding to the third electrode layers 6 in FIG. 2) directly below the formation target portions. The second groove portions P2 may be formed by, for example, mechanical scribing with a scribing needle. FIG. 6 illustrates a state after the formation of the second groove portions P2. The second groove portions P2 are formed at slightly offset positions in the X direction (in the figure, in the positive X direction) with respect to the first groove portions P1.

Figure 7:
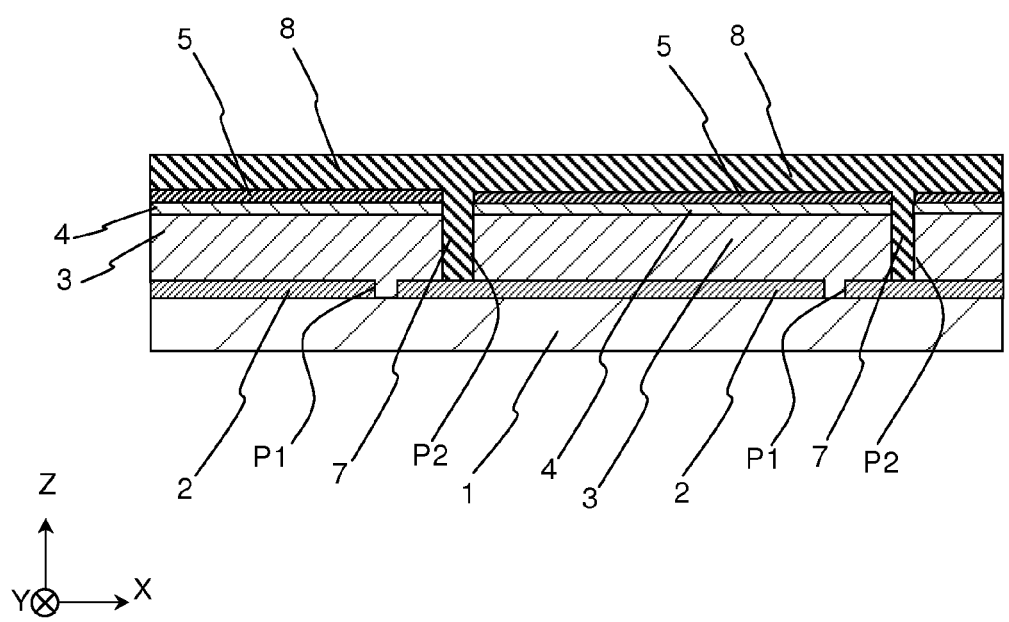
FIG. 7 is a cross-sectional view schematically illustrating a state of a photoelectric conversion device in process of manufacture.

After the second groove portions P2, the collector electrodes 8 and the connecting conductors 7 are formed. The collector electrodes 8 and the connecting conductors 7 may be formed by, for example, applying a paste (also referred to as a "conductive paste") which contains a metal powder, such as Ag, dispersed in a resin binder or the like and which is conductive by printing to form a desired pattern. FIG. 7 illustrates a state after the formation of the collector electrodes 8 and the connecting conductors 7.

After the formation of the collector electrodes 8 and the connecting conductors 7, third groove portions P3 are formed from formation target portions of the upper surface of the second electrode layer 5, the formation target portions extending linearly, to portions of upper surfaces of the first electrode layers 2 directly below the formation target portions. Each of the third groove portions P3 may have a width of, for example, about 40 to about 1000 μm. As with the second groove portions P2, the third groove portions P3 may be formed by mechanical scribing. In this way, the formation of the third groove portions P3 leads to the completion of the photoelectric conversion device 11 illustrated in FIGS. 1 and 2.

The present invention is not limited to the foregoing embodiments. Various changes may be made without departing from the gist of the invention.

EXAMPLE 1

A method for producing a semiconductor layer and a method for producing a photoelectric conversion device according to embodiments of the present invention were evaluated as described below. In this example, CIGS was used as a metal chalcogenide in a semiconductor layer.

<Preparation of Semiconductor Raw Material>

[a1] Ten millimoles (mmol) of $Cu(CH_3CN)_4 \cdot BF_4$ and 20 mmol of $P(C_6H_5)_3$ were dissolved in 100 ml of methanol. The resulting solution was stirred at 30° C. for 3 hours to prepare a first complex solution.

[a2] Forty millimoles of sodium methoxide ($CH_3ONa$) and 40 mmol of phenylselenol ($C_6H_5SeH$), which is an organic chalcogen compound, were dissolved in 300 ml of methanol. Furthermore, 7 mmol of $InCl_3$ and 3 mmol of $GaCl_3$ were dissolved therein. The resulting solution was stirred at room temperature for 2 hours to prepare a second complex solution.

[a3] The second complex solution was added dropwise to the first complex solution at a rate of 10 ml per minute to form a precipitate. The precipitate was filtered and dried at room temperature to give a mixture of single-source complexes represented by structural formulae 1 and 2.

[Chem. 1]

(1)

[Chem. 2]

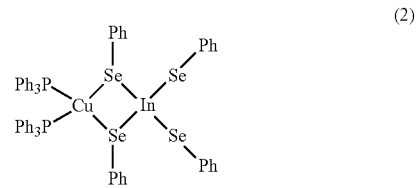

(2)

The mixture of the single-source complexes prepared in the foregoing step was dissolved in pyridine, which is an organic solvent, to prepare a liquid semiconductor raw material 1. A fraction of the semiconductor raw material 1 was taken out. Sodium perchlorate ($NaClO_4$) was added to the fraction of the semiconductor raw material 1 to prepare a liquid semiconductor raw material 2. The number of moles of $NaClO_4$ in the semiconductor raw material 2 was 2% of the number of moles of Cu in the semiconductor raw material 2.

<Production of First Semiconductor Layer According to Evaluation Sample 1>

A substrate having a 100 mm×100 mm square main surface and mainly containing glass was prepared. A first electrode layer containing Mo and so forth was formed on the main surface of the substrate. The semiconductor raw material 2 was applied onto the first electrode layer in a nitrogen gas atmosphere by a blade method and then heated to 300° C. for 10 minutes in a nitrogen gas atmosphere, thereby forming a film.

The film was heated to 550° C. for 1 hour in a hydrogen gas atmosphere containing Se vapor with a partial pressure ratio of 100 ppmv, thereby forming a first semiconductor layer according to evaluation sample 1, the first semiconductor layer being mainly composed of CIGS.

<Production of First Semiconductor Layer According to Comparative Sample 1>

A film was formed as in the formation of the first semiconductor layer according to evaluation sample 1 described above, except that the sodium perchlorate-free semiconductor raw material 1 was used. The film was heated to 550° C. for 1 hour in a hydrogen gas atmosphere containing 100 ppmv Se vapor, thereby forming a first semiconductor layer according to comparative sample 1, the first semiconductor layer being mainly composed of CIGS.

<Production of Photoelectric Conversion Device>

A second semiconductor layer and a second electrode layer were successively formed on each of the first semiconductor layers according to evaluation sample 1 and comparative sample 1 formed as described above, thereby producing a photoelectric conversion device.

Specifically, a substrate including the first semiconductor layer mainly composed of CIGS was immersed in an aqueous solution in which indium chloride and thiourea were dissolved. Thereby, a second semiconductor layer having a thickness of 50 nm and containing $In_2S_3$ was formed on the first semiconductor layer. A transparent film (second electrode layer) containing Al-doped zinc oxide was formed on the second semiconductor layer by a sputtering method.

<Measurement of Photoelectric Conversion Efficiency of Photoelectric Conversion Device>

The photoelectric conversion efficiency of each of the photoelectric conversion devices was measured with a fixed-light solar simulator. Here, the photoelectric conversion efficiency was measured under conditions in which the light radiation intensity to a light-receiving surface of each photoelectric conversion device was 100 mW/cm$^2$ and the air mass (AM) was 1.5. The photoelectric conversion efficiency indicates the percentage of solar light energy being converted into electrical energy in the photoelectric conversion device. Here, the photoelectric conversion efficiency was determined by dividing the value of electrical energy output from the photoelectric conversion device by the value of solar light energy incident on the photoelectric conversion device and then multiplying the resulting value by 100.

The photoelectric conversion efficiency of the photoelectric conversion device produced with the first semiconductor layer according to comparative sample 1 was 11.0%, whereas the photoelectric conversion efficiency of the photoelectric conversion device produced with the first semiconductor layer according to evaluation sample 1 was 11.5%.

The results demonstrated that in the case where the film was formed from the semiconductor raw material 2 containing the oxygen-generating agent (the first semiconductor layer according to evaluation sample 1), the photoelectric conversion efficiency was higher than that in the case where the film was formed from the semiconductor raw material 1 that did not contain an oxygen-generating agent (the first semiconductor layer according to comparative sample 1).

EXAMPLE 2

A method for producing a semiconductor layer and a method for producing a photoelectric conversion device according to embodiments of the present invention were evaluated as described below. In this example, CIGS was used as a metal chalcogenide in a semiconductor layer.

<Preparation of Semiconductor Raw Material>

As with Example 1, a semiconductor raw material 1 that did not contain sodium perchlorate and a semiconductor raw material 2 containing sodium perchlorate were prepared.

<Production of First Semiconductor Layer According to Evaluation Sample 2>

A substrate having a rectangular main surface with a long side of 800 mm and a short side of 500 mm and mainly containing glass was prepared. A first electrode layer containing Mo and so forth was formed on the main surface of the substrate. The semiconductor raw material 1 was applied onto the first electrode layer in a nitrogen gas atmosphere by a blade method and then heated to 300° C. for 10 minutes in the nitrogen gas atmosphere, thereby forming a film. The application and the heating step were repeated five times in total to form a five-layer laminate 1.

The semiconductor raw material 2 was applied onto the five-layer laminate by a blade method and then heated to 300° C. for 10 minutes in a nitrogen gas atmosphere, thereby forming a laminate 2 including six layers in total.

The six-layer laminate 2 was heated to 550° C. for 1 hour in a hydrogen gas atmosphere containing Se vapor with a partial pressure ratio of 100 ppmv, thereby forming a first semiconductor layer according to evaluation sample 2, the first semiconductor layer being mainly composed of CIGS.

<Production of First Semiconductor Layer According to Evaluation Sample 3>

A film was formed as in the formation of the first semiconductor layer according to evaluation sample 2 described above, except that the six-layer laminate was formed only from the semiconductor raw material 2. The six-layer laminate was heated to 550° C. for 1 hour in a hydrogen gas atmosphere containing 100 ppmv Se vapor, thereby forming a first semiconductor layer according to evaluation sample 3, the first semiconductor layer being mainly composed of CIGS.

<Production of First Semiconductor Layer According to Comparative Sample 2>

A film was formed as in the formation of the first semiconductor layer according to evaluation sample 2 described above, except that the six-layer laminate was formed only from the semiconductor raw material 1. The six-layer laminate was heated to 550° C. for 1 hour in a hydrogen gas atmosphere containing 100 ppmv Se vapor, thereby forming a first semiconductor layer according to comparative sample 2, the first semiconductor layer being mainly composed of CIGS.

<Production of Photoelectric Conversion Device>

A second semiconductor layer and a second electrode layer were successively formed on each of the first semiconductor layers according to evaluation sample 2, evaluation sample 3, and comparative sample 2 formed as described above, thereby producing a photoelectric conversion device.

Specifically, a substrate including the first semiconductor layer mainly composed of CIGS was immersed in a solution prepared by dissolving cadmium acetate and thiourea in aqueous ammonia. Thereby, a second semiconductor layer having a thickness of 50 nm and containing CdS was formed on the first semiconductor layer. A transparent film (second electrode layer) containing Al-doped zinc oxide was formed on the second semiconductor layer by a sputtering method.

<Measurement of Photoelectric Conversion Efficiency of Photoelectric Conversion Device>

As illustrated in FIGS. 8 to 10, each of the resulting photoelectric conversion devices was divided into 24 photoelectric conversion device sections (hereinafter, also referred to as "divided photoelectric conversion device sections") by dividing the device into six equal parts in the direction of the long side and dividing four equal parts in the direction of the short side. The photoelectric conversion efficiency of each of the divided photoelectric conversion device sections was measured in the same way as Example 1.

FIG. 8 illustrates the in-plane distribution of the photoelectric conversion efficiency (%) of the photoelectric conversion device produced with the first semiconductor layer according to evaluation sample 2. From the results illustrated in FIG. 8, the mean of the photoelectric conversion efficiency values of the photoelectric conversion device, i.e., the mean of the photoelectric conversion efficiency values of the 24 divided photoelectric conversion device sections, was 12.4%, and the standard deviation σ was 0.45. FIG. 9 illustrates the in-plane distribution of the photoelectric conversion efficiency of the photoelectric conversion device produced with the first semiconductor layer according to evaluation sample 3. From the results illustrated in FIG. 9, the mean of the photoelectric conversion efficiency values was 11.5%, and the standard deviation σ was 0.71. FIG. 10 illustrates the in-plane distribution of the photoelectric conversion efficiency of the photoelectric conversion device produced with the first semiconductor layer according to comparative sample 2. From the results illustrated in FIG. 10, the mean of the photoelectric conversion efficiency values was 11.2%, and the standard deviation σ was 0.69.

The results demonstrated that in the cases of including the films formed from the semiconductor raw material 2 containing the oxygen-generating agent (the first semiconductor layer according to evaluation sample 2 and the first semiconductor layer according to evaluation sample 3), the photoelectric conversion efficiency was higher than that in the case of the film formed only from the semiconductor raw material 1 that did not contain an oxygen-generating agent (the first semiconductor layer according to comparative sample 2).

In particular, in the case where the semiconductor raw material 2 containing the oxygen-generating agent was used to form only the uppermost layer (the first semiconductor layer according to evaluation sample 2), in-plane variations in photoelectric conversion efficiency was very low, and the mean photoelectric conversion efficiency was further increased.

REFERENCE SIGNS LIST

1 substrate
2 first electrode layer
3 first semiconductor layer (metal chalcogenide-containing semiconductor layer)
4 second semiconductor layer
5 second electrode layer
6 third electrode layer
7 connecting conductor
8 collector electrode
10 photoelectric conversion cell
11 photoelectric conversion device

The invention claimed is:

1. A method for producing a semiconductor layer, the method comprising:
    forming a lower film containing a metal element;
    forming an upper film on the lower film, the upper film containing the metal element and a substance that contains oxygen element;
    generating oxygen gas by heating the upper film; and
    forming a semiconductor layer containing a metal chalcogenide from the lower film and the upper film by allowing a chalcogen element to react with the metal element in the lower film and the upper film, wherein the substance contains an alkali metal element.

2. The method for producing a semiconductor layer according to claim 1, wherein at least one of the lower film and the upper film contains the chalcogen element.

3. The method for producing a semiconductor layer according to claim 1, wherein an atmosphere contains the chalcogen element when forming the semiconductor layer.

4. A method for producing a photoelectric conversion device, the method comprising:
    forming a first semiconductor layer by the method for producing the semiconductor layer according to claim 1; and
    forming a second semiconductor layer having a conductivity type different from the first semiconductor layer, and electrically connected to the first semiconductor layer.

* * * * *